United States Patent [19]
Ohta et al.

[11] Patent Number: 5,114,559
[45] Date of Patent: May 19, 1992

[54] THIN FILM DEPOSITION SYSTEM

[75] Inventors: Wasaburo Ohta; Masashi Nakazawa, both of Yokohama; Mikio Kinoshita, Kawasaki, all of Japan

[73] Assignee: Ricoh Company, Ltd., Tokyo, Japan

[21] Appl. No.: 587,998

[22] Filed: Sep. 25, 1990

[30] Foreign Application Priority Data

| | | |
|---|---|---|
| Sep. 26, 1989 [JP] | Japan | 1-249500 |
| Nov. 10, 1989 [JP] | Japan | 1-293240 |
| Jul. 9, 1990 [JP] | Japan | 2-181051 |
| Aug. 6, 1990 [JP] | Japan | 2-208423 |

[51] Int. Cl.⁵ .......................................... C23C 16/50
[52] U.S. Cl. ..................... 204/298.05; 204/192.31; 118/723
[58] Field of Search ............. 204/192.31, 298.05; 118/723; 427/38

[56] References Cited

U.S. PATENT DOCUMENTS

| | | | |
|---|---|---|---|
| 3,962,988 | 6/1976 | Murayama et al. | 204/298.05 X |
| 4,094,764 | 6/1978 | Boucher et al. | 204/298.05 X |
| 4,676,194 | 6/1987 | Satou et al. | 204/298.05 X |
| 4,854,265 | 8/1989 | Ohta et al. | 204/192.31 X |
| 4,876,984 | 10/1989 | Kinoshita et al. | 204/192.31 X |
| 4,960,072 | 10/1990 | Ohta et al. | 204/192.31 X |
| 4,974,544 | 12/1990 | Ohta | 204/192.31 X |
| 4,982,696 | 1/1991 | Kinoshita et al. | 204/192.31 X |

FOREIGN PATENT DOCUMENTS

| | | | |
|---|---|---|---|
| 0078777 | 7/1977 | Japan | 204/298.05 |
| 141562 | 11/1980 | Japan | 204/298.05 |
| 0157279 | 9/1984 | Japan | 204/298.05 |
| 0000472 | 1/1988 | Japan | 204/298.05 |
| 0009013 | 2/1988 | Japan | 204/298.05 |

*Primary Examiner*—Nam X. Nguyen
*Attorney, Agent, or Firm*—Cooper & Dunham

[57] ABSTRACT

A thin film deposition system includes an evacuated casing in which there is introduced an active gas or an inert gas or a mixture thereof. An evaporant carried by an evaporation source in the evacuated casing is evaporated and travels toward a substrate supported on the electrode. A filament for emitting thermions is disposed between the evaporation source and the electrode, and a grid for passing the evaporated material therethrough is disposed between the filament and the electrode. Power supplies are electrically connected to the evacuated casing, the evaporation source, the electrode, the filament, and the grid, for keeping the filament negative in potential with respect to the evacuated casing and the grid. Alternatively, the evacuated casing may not be connected to the power supplies so that the grid is kept positive with respect to the filament. The grid may be of a double-layer structure, with the gas inlet means connected to the grid.

2 Claims, 3 Drawing Sheets

THIN FILM DEPOSITION SYSTEM

BACKGROUND OF THE INVENTION

1. Field of the Invention

The present invention relates to a thin film deposition system for depositing thin films while simultaneously utilizing the strong reaction of the chemical vapor deposition (CVD) process and the film growth in a high vacuum of the physical vapor deposition (PVD) process, and also for easily depositing compound thin films.

2. Prior Art

Among well known thin film deposition systems for depositing thin films on substrates are CVD and PVD systems. The CVD systems provide a strong reactive process, whereas the PVD systems can deposit dense, strong thin films in a high vacuum.

There have been proposed various thin film deposition systems and processes based on the CVD and PVD principles. However, these conventional thin film deposition systems have been disadvantageous in that a substrate and a thin film deposited thereon are not intimately joined together, it is difficult to deposit a thin film on a substrate which is not resistant to heat, and desired compound thin films cannot easily be deposited.

Various efforts have been made to solve the above problems. One attempt is directed to a thin film deposition system known as an ion plating system. In the ion plating system, a hith-frequency electromagnetic field is generated between an evaporation source supporting an evaporant and an object on which a thin film is to be deposited, thereby ionizing the evaporant which is evaporated in an active gas or an inert gas and depositing the ionized evaporant as a thin film on the object in a vacuum. According to another proposal, a DC voltage is applied between an evaporation source and an object on which a thin film is to be deposited in a thin film deposition system known as a DC ion plating system. For further details, reference should be made to Japanese Patent Publications Nos. 52(1977)-29971 and 52(1977)-29091, for example.

Still another thin film deposition system which has been proposed to eliminate the drawbacks is disclosed in Japanese Laid-Open Patent Publication No. 59(1984)-89763. In the disclosed system, a substrate is held on an electrode confronting an evaporation source, a grid is disposed between the confronting electrode and the evaporation source, and a filament for emitting thermions is disposed between the grid and the evaporation source. The grid is held at a positive potential with respect to the filament while a thin film is being deposited on the substrate.

More specifically, the material which has been evaporated from the evaporation source is ionized by thermions emitted from the filament and the ionized material is accelerated by an electric field directed from the grid toward the confronting electrode when the ionized material passes through the grid. The accelerated ionized material impinges upon the substrate, whereupon a thin film is deposited on the substrate in intimate adhesion thereto.

With the conventional thin film deposition systems, it is possible to deposit a thin film which is of a compound of an evaporated material and a gas introduced in an evacuated casing. However, since the gas molecules in the evacuated casing are spread into the entire space in the evacuated casing, they may not effectively contribute to the reaction with high probability.

Furthermore, when an insulative thin film is deposited on a substrate by the known thin film deposition systems, the insulative thin film covers the confronting electrode and the inner surface of the evacuated casing. As a result, an arc discharge may be produced by an electric field directed from the grid toward the confronting electrode and the inner surface of the evacuated casing, whereupon the plasma may be rendered unstable and no good thin film may be deposited.

SUMMARY OF THE INVENTION

In view of the aforesaid shortcomings of the conventional thin film deposition systems, it is an object of the present invention to provide a thin film deposition system which can deposit a thin film, particularly an insulative thin film, on a substrate in highly strong adhesion thereto, which substrate may be a plastic material or the like that is not resistant to heat.

According to the present invention, there is provided a thin film deposition system comprising an evacuated casing, gas inlet means for introducing an active gas or an inert gas or a mixture of an active gas and an inert gas into the evacuated casing, an evaporation source disposed in the evacuated casing, for evaporating a material carried thereon, an electrode for supporting a substrate on which a thin film is to be deposited, the electrode being disposed in the evacuated casing in confronting relation to the evaporation source, a filament for emitting thermions, the filament being disposed between the evaporation source and the electrode, a grid for passing the evaporated material therethrough, the grid being disposed between the filament and the electrode, power supply means for developing a predetermined electric condition in the evacuated casing, and electric conductive means electrically connecting the power supply means to the evacuated casing, the evaporation source, the electrode, the filament, and the grid, for keeping the filament negative in potential with respect to the evacuated casing and the grid.

The evacuated casing is filled with an active gas or an inert gas or a mixture of these gases, and the evaporation source, the electrode, the filament, and the grid are all housed in the evacuated casing. The evacuated casing is made of a metallic material such as stainless steel, and is grounded.

The electrode and the evaporation source confront each other, and the electrode supports the substrate on its surface facing the evaporation source. The grid which passes the evaporated material therethrough is interposed between the evaporation source and the electrode, and is kept at the same potential as the evacuated casing.

The filament for emitting thermions is positioned between the evaporation source and the grid, and is of a negative potential with respect to the grid and the evacuated casing. Therefore, an electric field generated in the evacuated casing is directed from the grid and the evacuated casing toward the filament.

The power supply means for developing such an electric field in the evacuated casing is electrically connected to the evacuated casing, the evaporation source, the electrode, the filament, and the grid by the elecritically conductive means.

According to the present invention, there is also provided a thin film deposition system comprising an evacuated casing, means for introducing an active gas or a inert gas or a mixture of an active gas and an inert gas into the evacuated casing, an evaporation source disposed in the evacuated casing, for evaporating a material carried thereon, an electrode for supporting a substrate on which a thin film is to be deposited, the electrode being disposed in the evacuated casing in confronting relation to the evaporation source, a filament for emitting thermions, the filament being disposed between the evaporation source and the electrode, a grid for passing the evaporated material therethrough, the grid being disposed between the filament and the electrode, power supply means for developing a predetermined electric condition in the evacuated casing, and electric conductive means electrically connecting the power supply means to the evaporation source, the electrode, the filament, and the grid, for keeping the grid positive in potential with respect to the filament.

The evacuated casing is not grounded, and the grid is positive in potential with respect to the filament.

In each of the above thin film deposition systems, the grid may be of a double-layer structure, with the gas inlet means connected to the grid.

The above and other objects, features and advantages of the present invention will become more apparent from the following description when taken in conjunction with the accompanying drawings in which preferred embodiments of the present invention are shown by way of illustrative example.

DETAILED DESCRIPTION OF THE PREFERRED EMBODIMENTS

Figure 1:
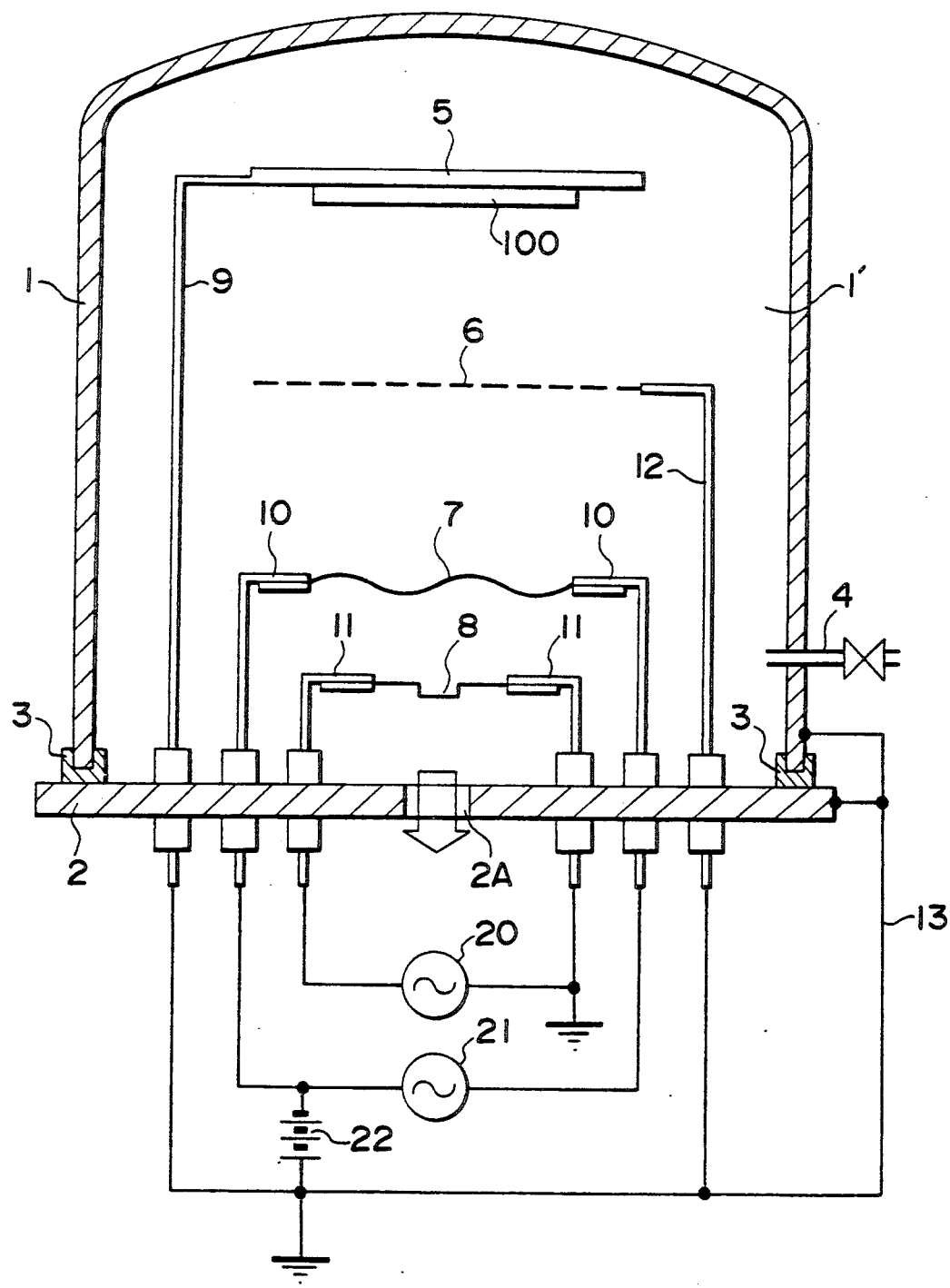
FIG. 1 is a schematic cross-sectional view of a thin film deposition system according to an embodiment of the present invention.

Like or corresponding parts are denoted by like or corresponding reference numerals throughout the views.

FIG. 1 schematically shows a thin film deposition system according to the present invention.

The thin film deposition system includes a base plate 2, a gasket 3 mounted on the base plate 2, and a bell jar 1 placed on the gasket 3. The bell jar 1 is made of a metallic material such as stainless steel. The bell jar 1 and the base plate 2 are hermetically coupled to each other by the gasket 3, jointly providing an evacuated casing 1'. An active gas and/or an inert gas may be introduced into the evacuated casing 1' through a known inlet arrangement 4. The base plate 2 has a central hole 2a defined therein which is coupled to a vacuum system (not shown), so that a vacuum can be developed in the evacuated casing 1' by the vacuum system.

A plurality of electrodes 9, 10, 11, 12, which also serve as supports, are mounted on the base plate 2 in electrically insulated relationship. The electrodes 9, 10, 11, 12 are electrically connected to power supplies (described later on) disposed outside of the evacuated casing 1' through suitable wires, while keeping the evacuated casing 1' hermetically sealed. The electrodes 9, 10, 11, 12 and the wires connected thereto serve as electrically conductive means.

The electrode 11 comprises a pair of electrode members which support therebetween a resistance-heating-type evaporation source 8 in the form of a boat source made of a metal such as tungsten, molybdenum, tantalum, or the like. The evaporation source 8 may instead be of a coil shape or a basket shape. Alternatively, an evaporation source used in a conventional vacuum evaporation system, such as an electron beam evaporation source, may be employed as the evaporation source 8.

The electrode 10 comprises a pair of electrode members which support therebetween a filament 7 of tungsten or the like for emitting thermions. The filament 7 may be in the form of a plurality of parallel filaments or a filament mesh for covering the area in which the material evaporated from the evaporation source 8 is spread.

The electrode 12 supports a grid 6 which is of such a configuration as to pass the evaporated material toward a confronting electrode 5. In the embodiment shown in FIG. 1, the electrode 12 is in the form of a mesh.

The confronting electrode 5 is supported on the distal end of the electrode 9. A substrate 100, on which a thin film is to be deposited, is supported by a suitable means on the confronting electrode 5 at its surface facing the evaporation source 8. The electrode 9 is shown as being connected to ground. However, the electrode 9 may be biased by a DC power supply connected between the electrode 9 and ground, or may be held at the same potential as the filament 7. The electrode 9 may not necessarily be grounded.

The electrode 11 which supports the evaporant 8 is connected to an AC power supply 20 for heating the evaporation source 8. A DC power supply may be used in place of the AC power supply 20.

The electrode 10 which supports the filament 7 is connected to an AC power supply 21. The AC power supply 21 may be replaced with a DC power supply.

One of the electrode members of the electrode 10 is also connected to a negative terminal of a DC power supply 22, whose positive terminal is grounded and joined to the electrodes 9, 12 and also a wire 13 that is connected to the base plate 2 and the bell jar 1. The filament 7 is therefore kept at a negative potential with respect to the grid 6 and the evacuated casing 1'. Between the grid 6, the evacuated casing 1', and the filament 7, a generated electric field is directed from the grid 6 and the evacuated casing 1' toward the filament 7, or stated otherwise, the filament 7 is negative in potential with respect to the evacuated casing 1' and the grid 6.

One terminal of the power supply 20 is shown as being grounded. However, a DC power supply may be connected to the ground terminal of the power supply 20, for biasing the evaporation source 8. The power supply 20 may not necessarily be grounded.

In the thin film deposition system shown in FIG. 1, a stable plasma condition can be produced in the vacuum casing 1' through adjustments of the filament heating power supply 21 and the biasing DC power supply 22. Since thermions emitted from the filament 7 contribute to the ionization of the evaporated material, the stable plasma condition can be maintained and reproduced, so that thin films of good quality can stably be produced.

Inasmuch as the potential of the filament 7 is negative with respect to the evacuated casing 1' and the grid 6, a thin film which is being deposited on the substrate 100 is prevented from suffering sputtering which would otherwise be caused by ion bombardment upon the inner surface of the evacuated casing 1'. Therefore, the deposited thin film is of high purity. Particularly, insulative thin films of large surface area can be deposited on a mass-production basis.

Actually, the electrically conductive means include switches which are connected to the wires. The process of depositing thin films on substrates is carried out when these switches are operated on. However, the switches are omitted from illustration for the sake of brevity.

A process of depositing a thin film with the thin film deposition system shown in FIG. 1 will now be described below.

First, the bell jar 1 is opened, and the substrate 100 is supported on the confronting electrode 5, and a charge or a material to be evaporated is placed on the evaporation source 8. Of course, the material to be evaporated is selected depending on the type of a thin film to be deposited.

Then, the bell jar 1 is closed to hermetically seal the evacuated casing 1', and the vacuum casing 1' is evacuated to develop a vacuum therein by the vacuum system. Thereafter, an active gas or an inert gas or a mixture of these gases is introduced into the evacuated casing 1' under a pressure ranging from 10 to $10^{-3}$ Pa. It is assumed here that the introduced gas is an active gas such as of oxygen or the like or an inert gas such as of argon or the like.

The thin film deposition system is now energized to heat the evaporation source 8. The evaporant on the evaporation source 8 is evaporated. The evaporated atoms travel toward the substrate 100 while being spread apart, and pass through the grid 6. Some of the evaporated atoms are attached, as they are or as a compound, to the grid 6 and the inner surface of the evacuated casing 1'.

Thermions, which are emitted from the filament 7, are accelerated by an electric field generated by the grid 6 and the evacuated casing 1', and travel toward the grid 6 and the evacuated casing 1'. When the thermions impinge upon molecules of the gas in the evacuated casing 1' and evaporated atoms, the thermions ionize these gas molecules and evaporated atoms into positive ions, thereby producing a plasma condition in a space near the filament 7. The thermions are attracted by the electric field produced by the grid 6 and eventually absorbed by the grid 6. Therefore, the thermions do not reach the substrate 100, which is thus prevented from being heated by electron bombardment thereon.

The evaporated material which is partly ionized passes through the grid 6. At this time, the evaporated material is further ionized by impingement upon thermions which oscillate up and down near the grid 6 and the ionized gas molecules.

Those atoms, which are not yet ionized, of the evaporated material having passed through the grid 6 are ionized into positive ions by impingement upon the ionized gas molecules.

Since the evaporated atoms and the ionized evaporated atoms leave the evaporant with energy when they are evaporated, they travel toward the confronting electrode 5, and impinge upon the substrate 100, forming a desired thin film on the substrate 100. If a negative potential is applied to the electrode 5, an electric field is generated from the grid 6, etc. toward the electrode 5, accelerating the ions, and the accelerated ions impinge upon the substrate 100.

In addition, the positively ionized evaporant is accelerated toward the substrate 100 by the electric field which is directed from the grid 6 toward the electrode 5. Therefore, the evaporated material impinges upon the substrate 100 at high speed.

Since the thin film is formed by impingement of the ionized particles upon the substrate 100, the thin film intimately adheres to the substrate 100 and has a good crystalline structure and orientation.

If an active gas is introduced alone or in combination with an inert gas, then the evaporated material can react with the active gas, thus depositing a compound thin film on the substrate. Since the evaporated material is ionized at a high ratio with stability, compound thin films of desired properties can easily and reliably be produced. Also, insulative compound thin films can stably and easily be produced.

For example, if argon is introduced as an inert gas and oxygen is introduced as an active gas under a pressure ranging from 10 to $10^{-2}$ Pa and aluminum is selected as the material to be evaporated, then an insulative thin film of aluminum oxide is deposited on the substrate.

If silicon or silicon monoxide is selected as the material to be evaporated, then an insulative thin film of silicon dioxide is deposited on the substrate. If indium, tin, or zinc is used as the material to be evaporated, then a conductive thin film of indium oxide, tin oxide, or zinc oxide is deposited on the substrate. If nitrogen or ammonia is introduced as an active gas in combination with argon and titanium, tantalum, or iron is selected as the material to be deposited, then a thin film of titanium nitride, tantalum nitride, or iron nitride is deposited on the substrate. If gold or aluminum is used with an argon gas, a dense thin film of gold or aluminum is deposited on the substrate.

Because the thermions emitted from the filament are effectively attributed to the ionization of the evaporated material and the introduced gas, the evaporated gas can be ionized in a high vacuum under a pressure of $10^{-3}$ or lower. Therefore, the entrapment of gas molecules into the thin film is minimized, with the result that the deposited thin film is of high purity. The deposited thin film is highly dense in structure. Although it is known that the density of thin films is lower tan that of bulk materials, the density of thin films which are deposited by the thin film deposition system according to the present invention is very close to that of bulk materials. Consequently, the thin film deposition system according to the present invention lends itself to the deposition of semiconductor thin films for use integrated circuits and LSI circuits.

Figure 2:
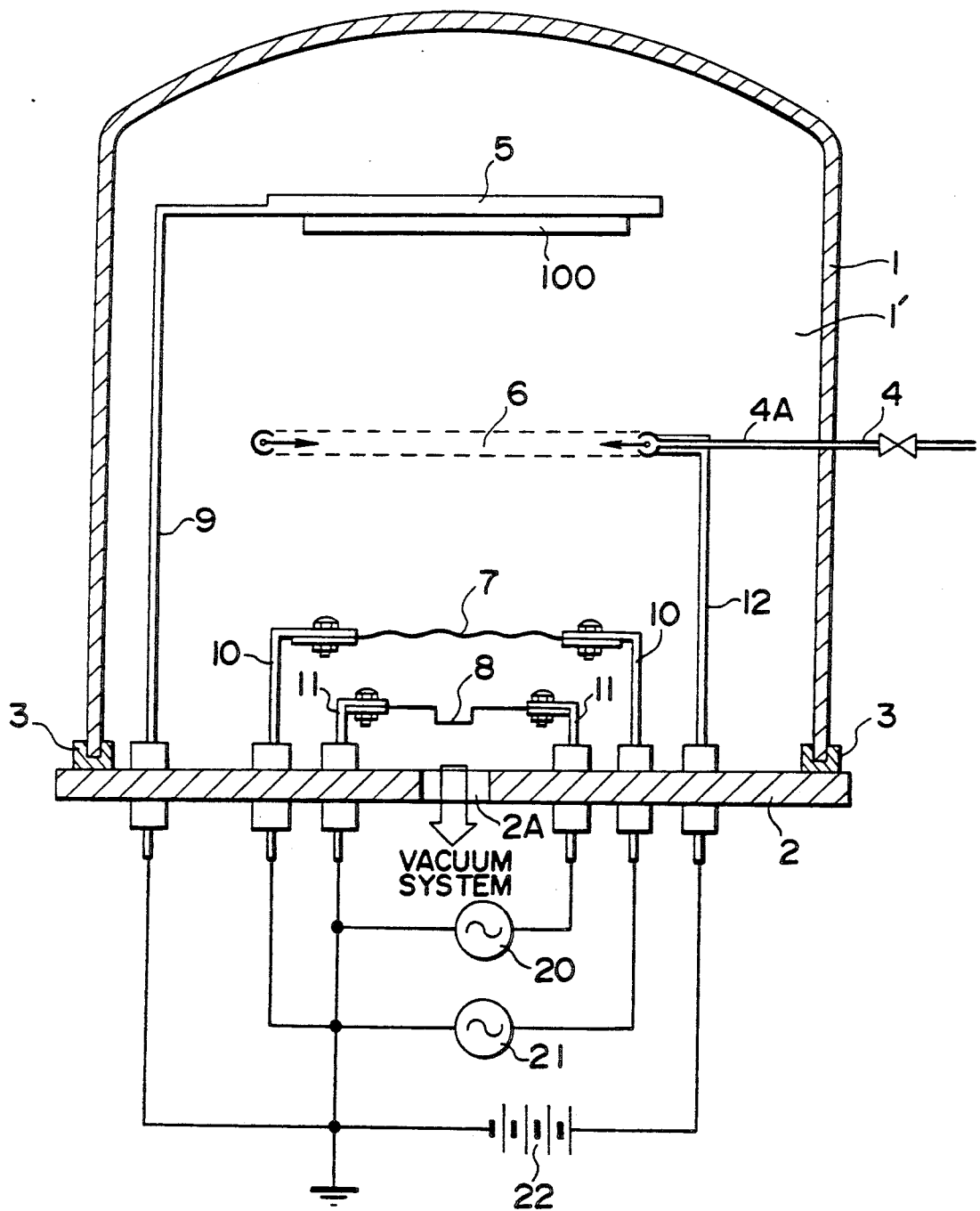
FIG. 2 is a schematic cross-sectional view of a thin film deposition system according to another embodiment of the present invention.

FIG. 2 shows a thin film deposition system according to another embodiment of the present invention. The thin film deposition system shown in FIG. 2 is basically the same as the thin film deposition system shown in FIG. 1 except as follows:

The grid 6 is of a double-layer mesh structure to which a gas inlet pipe 4a is connected between the two layers. The gas inlet pipe 4a is connected to the gas inlet arrangement 4 so that the active gas and/or the inert gas from the inlet arrangement 4 may be introduced into the grid 6. The electrode 12 and the gas inlet pipe 4A are electrically insulated from each other in a suitable manner. The double-layer grid 6 may be replaced with a grid of any other structure insofar as it can keep the introduced gas stagnant or reserved in the grid.

One of the electrode members of the electrode 10 is grounded. The electrode 12 is connected to a positive terminal of the DC power supply 22 whose negative terminal is grounded. The bell jar 1 is neither electrically connected to the power supply 22 nor grounded. Therefore, the filament 7 is negative in potential with respect to the grid 6, or the grid is positive in potential with respect to the filament 7.

The gas introduced from the gas inlet pipe 4a tends to stay in and around the grid 6, and hence is highly dense near the grid 6. Therefore, active gas molecules near the grid 6 are ionized at a higher rate for greater reaction with the evaporated material when a compound thin film is to be deposited. Inert gas molecules near the grid 6 are also ionized at a higher rate for accelerated ionization of the evaporated material.

Figure 3:
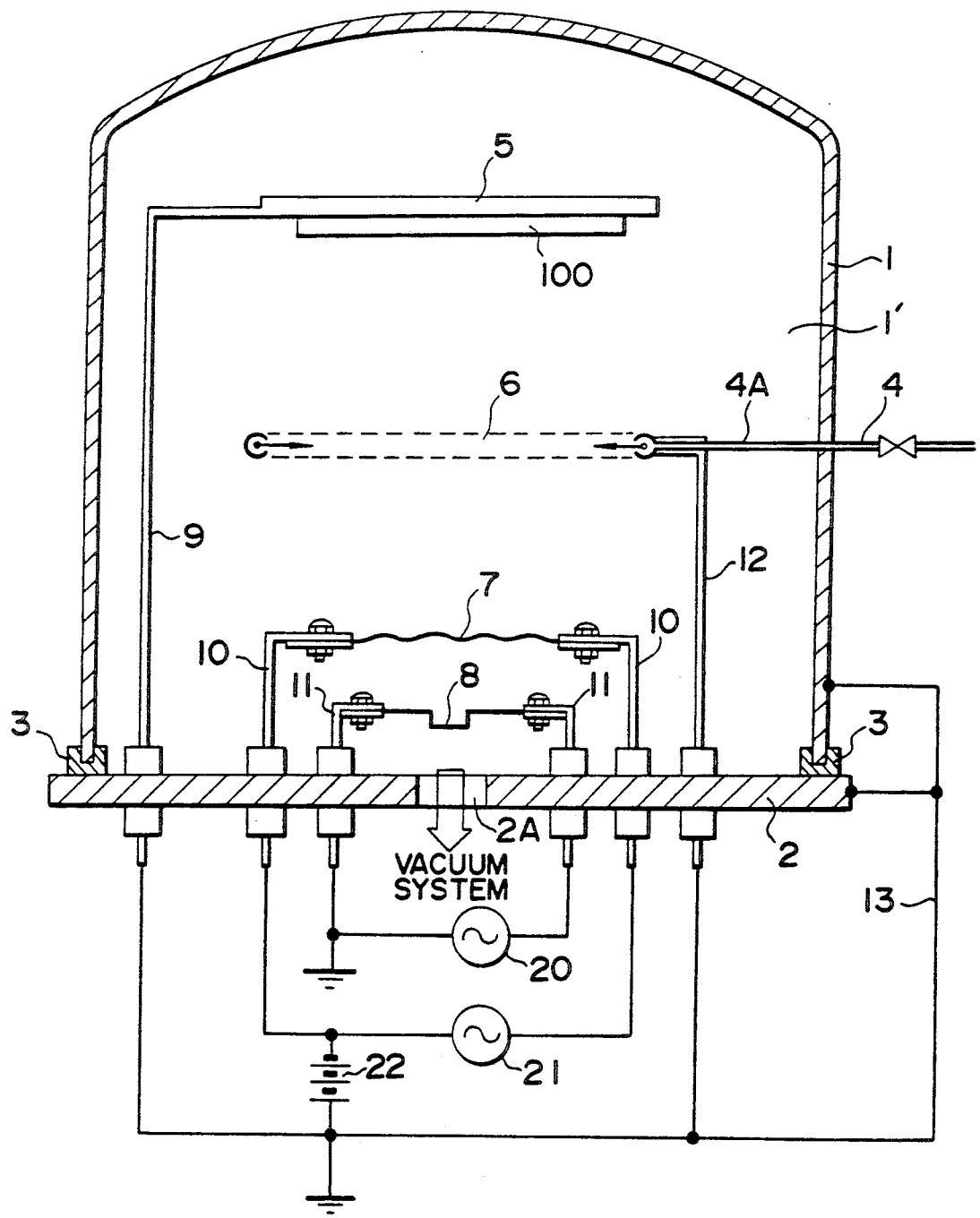
FIG. 3 is a schematic cross-sectional view of a thin film deposition system according to still another embodiment of the present invention.

FIG. 3 schematically shows a thin film deposition system according to still another embodiment of the present invention. The thin film deposition system shown in FIG. 3 is basically a combination of the thin film deposition systems shown in FIGS. 1 and 2. Specifically, the thin film deposition system shown in FIG. 3 differs from the thin film deposition system shown in FIG. 1 in that the grid 6 is of a double-layer mesh structure and also differs from the thin film deposition system shown in FIG. 2 in that the filament 7 is negative in potential with respect to the vacuum casing 1' and the grid 6. The other details of the thin film deposition system shown in FIG. 3 are identical to those shown in FIGS. 1 and 2.

With the present invention, not only a thin film of a single element such as a thin film of a metal, but also a compound thin film can be deposited on a substrate in intimate adhesion thereto in a state closer to a stoichiometric thin film. The thin film deposition system according to the present invention is therefore capable of depositing thin films in a wider range of applications.

If the potential of the filament is negative with respect to the evacuated casing and the grid as shown in FIGS. 1 and 3, any sputtering which would otherwise be caused by ion bombardment on the inner surface of the evacuated casing is minimized, and hence thin films of high purity can be deposited. Furthermore, insulative thin films of large surface area can be mass-produced.

Since the evaporated material as ionized has a high electric energy (i.e., electron and ion temperatures), thin films which require reaction and crystallization ca be produced without thermal energy in the form of high reaction and crystallization temperatures, and hence can be formed at low temperature.

Although certain preferred embodiments have been shown and described, it should be understood that many changes and modifications may be made therein without departing from the scope of the appended claims.

What is claimed is:

1. A thin film deposition system comprising: a vacuum casing;
   gas inlet means for introducing an active gas or an inert gas or a mixture of an active gas and an inert gas into said vacuum casing;
   an evaporation source disposed in said vacuum casing, for evaporating a material carried thereon;
   an electrode for supporting a substrate on which a thin film is to be deposited, said electrode being disposed in said vacuum casing in confronting relation to said evaporation source;
   a filament for emitting thermions, said filament being disposed between said evaporation source and said electrode;
   a grid for passing the evaporated material therethrough, said grid being disposed between said filament and said electrode;
   power supply means for developing a predetermined electric condition in said vacuum casing;
   electric conductive means electrically connecting said power supply means to said vacuum casing, said evaporation source, said electrode, said filament, and said grid, for keeping said filament negative in potential with respect to said vacuum casing and said grid; and
   wherein said grid is of a double-layer structure, and said gas inlet means is connected to said grid.

2. A thin film deposition system comprising: a vacuum casing;
   means for introducing an active gas or an inert gas or a mixture of an active gas and an inert gas into said vacuum casing;
   an evaporation source disposed in said vacuum casing, for evaporating a material carried thereon;
   an electrode for supporting a substrate on which a thin film is to be deposited, said electrode being disposed in said vacuum casing in confronting relation to said evaporation source;
   a filament for emitting thermions, said filament being disposed between said evaporation source and said electrode;
   a grid for passing the evaporated material therethrough, said grid being disposed between said filament and said electrode;
   power supply means for developing a predetermined electric condition in said vacuum casing;
   electric conductive means electrically connecting said power supply means to said evaporation source, said electrode, said filament, and said grid, for keeping said grid positive in potential with respect to said filament; and
   wherein said grid is of a double-layer structure, and said means for introducing gas is connected to said grid.

* * * * *